United States Patent
Shnitser et al.

(10) Patent No.: US 9,818,894 B2
(45) Date of Patent: Nov. 14, 2017

(54) PHOTODETECTOR WITH NANOWIRE PHOTOCATHODE

(71) Applicant: Physical Optics Corporation, Torrance, CA (US)

(72) Inventors: Paul Shnitser, Irvine, CA (US); Gennady Medvedkin, Torrance, CA (US)

(73) Assignee: Physical Optics Corporation, Torrance, CA (US)

( * ) Notice: Subject to any disclaimer, the term of this patent is extended or adjusted under 35 U.S.C. 154(b) by 0 days.

(21) Appl. No.: 15/256,360

(22) Filed: Sep. 2, 2016

(65) Prior Publication Data
US 2017/0062637 A1    Mar. 2, 2017

Related U.S. Application Data

(60) Provisional application No. 62/213,221, filed on Sep. 2, 2015.

(51) Int. Cl.
| | | |
|---|---|---|
| H01L 31/00 | (2006.01) |
| H01L 31/0352 | (2006.01) |
| H01L 31/0304 | (2006.01) |
| H01L 31/18 | (2006.01) |
| H01J 43/00 | (2006.01) |

(52) U.S. Cl.
CPC ...... *H01L 31/035227* (2013.01); *H01J 43/00* (2013.01); *H01L 31/03044* (2013.01); *H01L 31/1856* (2013.01)

(58) Field of Classification Search
CPC ......... H01L 31/035227; H01L 31/1856; H01L 31/03044; B82Y 10/00; B82Y 20/00; H01J 43/00
See application file for complete search history.

(56) References Cited

U.S. PATENT DOCUMENTS

| | | | | |
|---|---|---|---|---|
| 7,485,872 | B2 * | 2/2009 | Frisch | G01T 1/22 250/251 |
| 9,347,141 | B2 * | 5/2016 | Yang | C25B 11/035 |
| 2007/0187596 | A1 * | 8/2007 | Frisch | G01T 1/22 250/309 |
| 2013/0105305 | A1 * | 5/2013 | Yang | C25B 11/035 204/242 |

OTHER PUBLICATIONS

Zhong et al., "Synthesis of p-Type Gallium Nitride Nanowires for Electronic and Photonic Nanodevices", 2003, Nano Letters, Vo., 3 No. 3, pp. 343-346 (Apr. 2003).*
Chen et al., "Shape-controlled synthesis of one-dimensional AlxGa1—xN nanotower arrays: structural characteristics and growth mechanism", 2014, Journal of Physics D: Applied Physics, vol. 47, pp. 065311 (published on Jan. 20, 2014).*
Wang et al., "Highly efficient, spectrally pure 340 nm ultraviolet emission from AlxGa1—xN nanowire based light emitting diodes", 2013, Nanotechnology, Vo. 24, pp. 345201 (6pp), published Jul. 30, 2013.*

* cited by examiner

*Primary Examiner* — Nikolay Yushin
(74) *Attorney, Agent, or Firm* — Sheppard, Mullin, Richter & Hampton LLP; Daniel Yannuzzi

(57) ABSTRACT

A photodetector assembly for ultraviolet and far-ultraviolet detection includes an anode, a microchannel plate with an array of multichannel walls, and a photocathode layer disposed on the microchannel plate. Additionally, the photocathode may include nanowires deposited on a top surface of the array of multichannel walls.

25 Claims, 3 Drawing Sheets

PHOTODETECTOR WITH NANOWIRE PHOTOCATHODE

TECHNICAL FIELD

The present invention relates generally to an ultraviolet photodetector. More particularly, certain embodiments relate to an ultraviolet photodetector with a nanowire photocathode.

BACKGROUND

A photocathode is an opto-electronic device that emits electrons when it is struck by photons of light. A photocathode typically is used in a vacuum tube with an anode structure, where the electrons emitted from the photocathode pass directly to the anode structure. Where the photocathode includes electron-multiplying devices, such as, for example, multichannel walls and dynodes on a microchannel plate of the photocathode, large numbers of electrons may be emitted in response to the relatively few number of electrons emitted by the photocathode. This can be useful in a number of applications.

Solar blind deep ultraviolet (UV) photodetectors have attracted a strong interest due to their broad potential applications in the field of solar observations, ultraviolet astronomy, military defense, automatization, short range communications, security, as well as environmental and biological research.

Microchannel plate-based, photon-counting detectors remain the dominant technology for UV applications. However, future space missions in astrophysics, solar physics, planetary physics, Earth observation, and other disciplines may benefit from a highly sensitive, solar blind, radiation-hard UV and Far-UV photodetectors with a large sensitive area for more accurate readings and applications. Currently, most UV photodetectors require cesiated photocathodes in sealed tube. But this results in the UV photodetectors having a low quantum efficiency. Thus, there currently is a need for more efficient UV and Far-UV photodetectors that are non-cesiated with a greater quantum efficiency.

BRIEF SUMMARY OF EMBODIMENTS

Embodiments of the present disclosure are directed toward a highly efficient UV and Far-UV photodetector with a nanowire photocathode. Some such embodiments may include a photodetector assembly with an anode, a microchannel plate with an array of multichannel walls, and a photocathode layer. Specifically, in some instances, the photocathode layer may be include nanowires, where the nanowires are deposited on a top surface of the array of multichannel walls. This may allow the nanowire to be further exposed and struck by photons of light.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claimed attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

The following description is not to be taken in a limiting sense, but is made merely for the purpose of describing the general principles of the disclosed embodiments. The present embodiments address the problems described in the background while also addressing other additional problems as will be seen from the following detailed description. Numerous specific details are set forth to provide a full understanding of various aspects of the subject disclosure. It will be apparent, however, to one ordinarily skilled in the art that various aspects of the subject disclosure may be practiced without some of these specific details. In other instances, well-known structures and techniques have not been shown in detail to avoid unnecessarily obscuring the subject disclosure.

Microchannel-based photon-counting detectors remain the dominant technology for many industrial applications, such as modern observational astrophysics. This is due to key performance parameters provided in microchannel-based photon-counting detectors, such as large format (in area and pixel count), low background, zero read noise, long-wavelength rejection, radiation tolerance, and room temperature operation. Some embodiments of the disclosure provide a far-UV detector with an efficient $Al_xGa_{1-x}N$ nanowire deposited on a photocathode layer fabricated directly on a surface of a silicon-based multichannel wall. The $Al_xGa_{1-x}N$ nanowire provides a significant improvement in photodetector sensitivity, background noise, and longevity in harsh conditions, such as outer space. However, it's applications are not so limited.

Figure 1A:
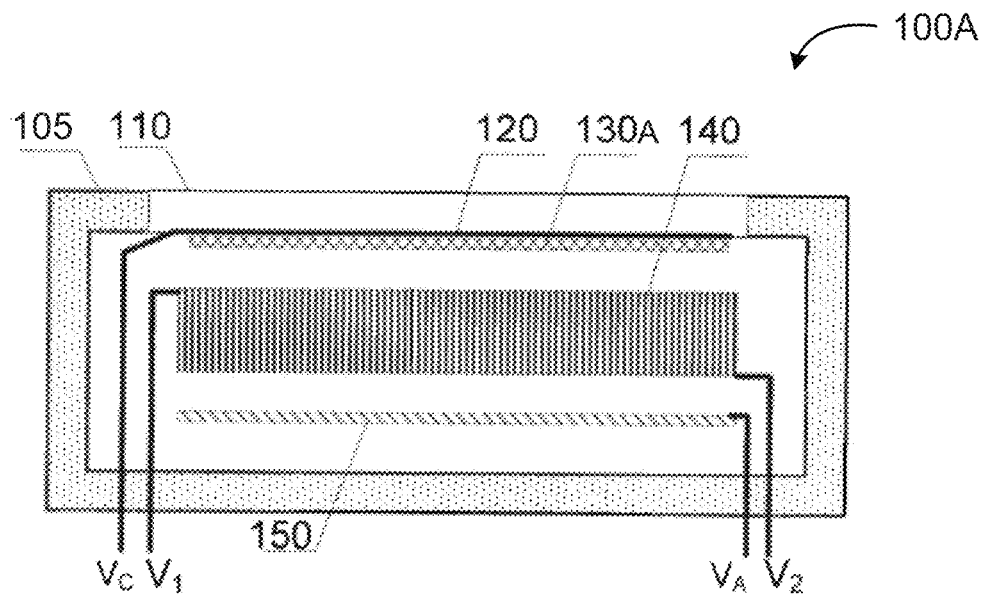
FIG. 1A illustrates a photodetector operating in transmission mode in accordance with various embodiments of the present application.

FIG. 1A illustrates a photodetector 100A operating in a transmission mode in accordance with various embodiments of the present application. FIG. 1A is generally described in conjunction with FIG. 1B, which illustrates a photodetector 100B operating in a reflection mode. Generally, the aspects described herein with respect to photodetector 100A may equally apply to photodetector 100B. However, the major distinction being that the transmission based photocathode 130A requires the incident photons to travel through the substrate material before they impinge on the photocathode 130A material. In contrast, a reflective based photocathode 130B requires the photons to travel through the active photocathode 130B area before reflecting off of the substrate-cathode interface and traveling back through the photocathode 130B area prior to the emission of photoelectrons from the photocathode surface. Both the reflective and transmissive configurations lead to quantum efficiency losses in the photon-photoelectron conversion process.

By way of example only, the photodetector 100A, 100B may include a photomultiplier tube equipped with a vacuum envelope 105 that is a sensitive light detector in the ultraviolet, visible, and near infrared ranges of the electromagnetic spectrum. The photodetector 100A, 100B may also include a transparent window 110. The transparent window 110 may be configured so that the transparent electrode 120 and the thin film photocathode 130 are deposited in the internal portion of the transparent window 110. The transparent window 110 may be suitable for allowing a light source to be transmitted to the surface of the thin-film photocathode 130A, 130B. The photodetector 100 may multiply the current produced by incident light by as much as 100 million times in multiple dynode stages, enabling individual photons to be detected even when the incident flux of light is very low.

In some instances, the thin-film photocathode 130 may be cesium free using group III-nitride materials, such as GaN, AlN, and their alloys by way of example only. Group III-nitride materials are superior for advanced UV detection due to their wide direct band gap and high thermal, chemical, mechanical, and radiation tolerance. Using group III-nitride materials may allow the photocathode 100A, 100B to achieve a highly efficient, solar blind, and stable UV response. Additionally, in various embodiments there is no longer a need to activate the thin-film photocathode 130A, 130B by cesium or oxygen ions in order to bend the edges of valence and conduction bands by the large internal surface field created by charged ions attached to the film at its vacuum interface. Rather, group-III nitride materials, such as GaN nanowires, may have a built-in surface electric field that is automatically generated in their growth process. As such, these large surface electric fields at the nanowire tips stimulate electron emission through a relatively low potential barrier, even for electrons located at the bottom of the conduction band after thermalization. Combined with electron confinement with the nanowires in a vacuum envelope 105, this facilitates efficient photoelectron emission in the photocathode 130A, 130B.

UV detectors that have high sensitivity at wavelengths below 280 nm are called "solar-blind." Both GaN and $Al_xGa_{1-x}N$ are efficient solar-blind photodetectors that are able to detect wavelength regions below 220 nm, and even below 120 nm in some cases, which reaches the X-ray spectral low energy frontier. Thus, thin-film photocathodes 130A, 130B composed of GaN or $Al_xGa_{1-x}N$ are high-performance photodetectors that experience high sensitivity, high signal-to-noise ratio, high spectral sensitivity, high speed, and high stability.

Although not shown here, the thin-film photocathode 130 may include a plurality of elements projecting outwardly from its base, referred to herein as nanowires. The nanowires may have a diameter ranging from 30-100 nm with a length ranging from 0.1 μm to 500 nm. The nanowires may be disposed in an array of elements that are evenly distributed, with a range of $10^3$ to $10^{20}$ nanowires per square centimeter on the base of the thin-film photocathode 130. In some embodiments, the nanowire structures may be constructed of material made of GaN and $Al_xGa_{1-x}N$. For the nanowire structures made of $Al_xGa_{1-x}N$, x may be any stoichiometric value less than 1.

Additionally, in some embodiments, a microchannel plate 140 is placed in the photodetector 100A, 100B. The microchannel plate 140 may be a planar component used for the detection of particles and impinging radiation, such as ultraviolet rays and X-rays. The microchannel plate 140 may intensify single particles or photons by the multiplication of electrons via secondary emission, and further provide spatial resolution when the microchannel plate 140 has separate, parallel channels or walls. Thus, the microchannel plate 140 may multiply photoelectrons emitted by the thin-film photocathode 130 and anode 150. In some embodiments, the microchannel plate 140 may be patterned to have square, rectangular, or hexagonal shape. They can also be made with smaller pore sizes for higher spatial resolution.

Figure 1B:
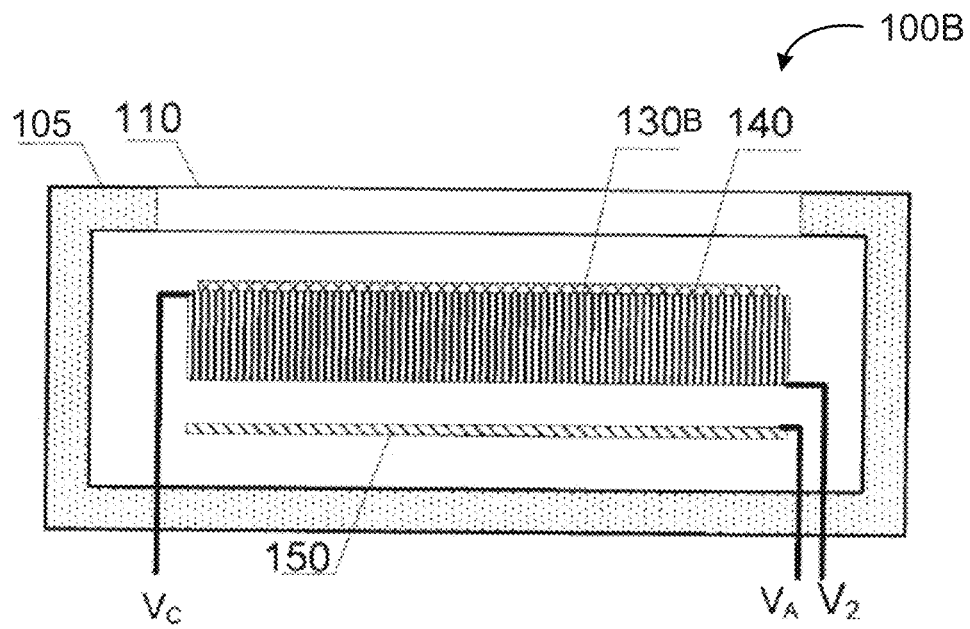
FIG. 1B illustrates a photodetector operating in reflection mode in accordance with various embodiments of the present application.

However, the thin-film photocathode 130B operating in transmission mode is less efficient than the thin-film photocathode 130A operating the reflection mode. This is due to the light absorption that takes place in the electroconductive electrode 120 and the excess absorption in the bottom layers when in transmission mode. These effects can be avoided in various embodiments by fabricating the photocathode 100B directly on the entrance surface of the microchannel plate 140, as illustrated in FIG. 1B. Thus, when the photodetector 100A is operating in a transmission mode, the microchannel plate 140 is positioned so that there is space between the thin-film photocathode 130A and the microchannel plate 140. Where the photodetector 100B is operating in the reflection mode, the photodetector 100B is deposited directly onto the entrance or top surface of the microchannel plate 140, which aids in minimizing the less efficient operation of the photocathode 100A in the transmission mode.

The electric potentials Vc 160, V1 170, V2 180, and Va 190 allow for the acceleration of the electrons to the microchannel plate 140 that were emitted from the thin-film photocathode 130. The electric potentials Vc 160, V1 170, V2 180, and Va 190 also allow for the multiplication of the electrons in the microchannel plate 140 due to the secondary electron emission and collection of the multiplied electrons on the anode 150.

Figure 2:
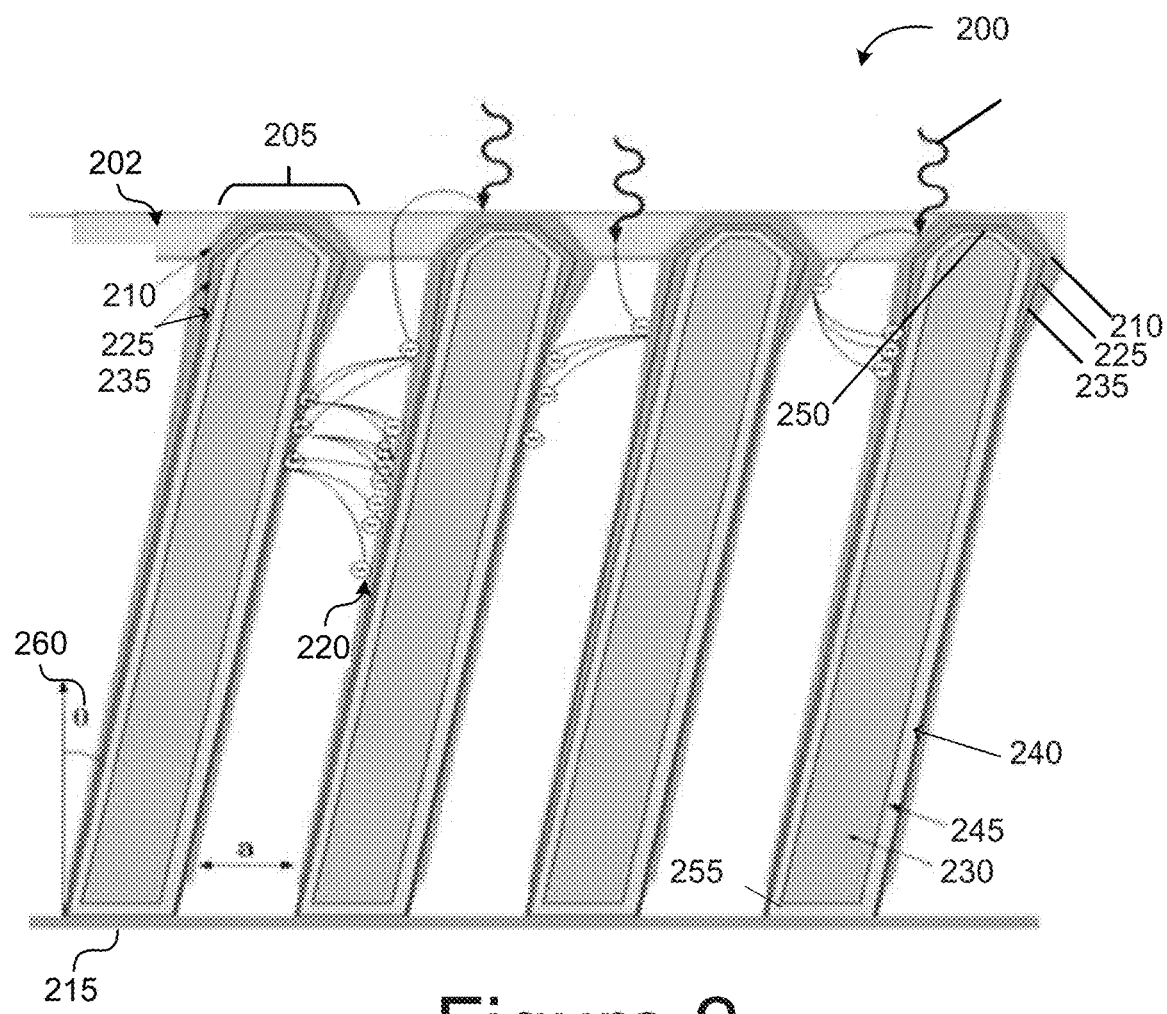
FIG. 2 illustrates a microchannel plate with a thin-film photocathode layer deposited onto a top surface of a microchannel plate in accordance with various embodiments of the present application.

FIG. 2 illustrates a microchannel plate 200 with a thin-film photocathode layer 210 deposited onto its entrance surface 202 in accordance with various embodiments of the present application. Here, the microchannel plate 200 may be placed in a windowless photodetector as a result of the thin-film photocathode layer's 210 ability to detect radiation with wavelengths in the far UV spectral range, which consist of wavelengths between 10 nm to 200 nm.

The microchannel plate 200 may include an array of multichannel walls 205 spaced in parallel formation with one another. Each multichannel wall 205 may have an internal diameter ranging from 6 to 20 microns, with its inner wall having proper electrical resistance and secondary emissive properties. Additionally, in some embodiments, the multichannel walls 205 may be inclined at an angle 260 with respect to the base 215 of the microchannel plate 200. The incline may range from 5 to 25 degrees.

Accordingly, each multichannel wall 205 may act as an independent electron multiplier. When the primary electron impinges on the inner wall of the channel, secondary electrons 220 are emitted. Accelerated by the electric field of the voltage applied across both ends of the microchannel plate 200, the secondary electrons 220 may bombard the multichannel wall 205 again to produce additional secondary electrons. This process may be repeated again many times along the multichannel wall 205, and as a result, a large number of electrons are released from the output end.

In some embodiments, each multichannel wall 205 may be composed of a silicon substrate 230. As further illustrated, the multichannel wall 205 may include a photocathode layer 210 that is grown on the silicon substrate 230. In some embodiments, the photocathode layer 210 may be composed of $Al_xGa_{1-x}N$. Byway of example only, the stoichiometric value, x, may be 0.25, but in some embodiments it is any value less than 1 but greater than 0. Additionally, in further embodiments, the $Al_xGa_{1-x}N$ of the photocathode layer 210 may be doped with magnesium. The p-doped $Al_{0.25}Ga_{0.75}N$ photocathode 210 may be deposited at the entrance or top surface 202 of the multichannel wall 205.

Furthermore, the photocathode layer 210 may be composed of $Al_xGa_{1-x}N$ nanowires grown on the silicon substrate 230. The $Al_xGa_{1-x}N$ nanowires deposited along the sides of the multichannel wall 205 may act as a secondary electron emission layer, which may induce the emission of secondary electrons 220. However, it should be noted that the photocathode layer 210 may also include materials such as GaN, such that GaN nanowires are grown on the silicon substrate 230.

In some embodiments, an electroconductive layer 235 may be placed on top of the silicon substrate 230. The electroconductive layer 235 may be made of a thin Ti or TiN layer, which may serve as a voltage divider within the multichannel wall 205 and replenish electrons to the secondary electron emission layer of the photocathode layer 210. More specifically, electrons from the electroconductive layer 235 may replenish charges removed from the p-doped $Al_xGa_{1-x}N$ of the photocathode layer 210, which may cause significant banding of conductivity zone at its interface with vacuum. By way of example, the TiN layer of the electroconductive layer 235 may be formed by coating the silicon substrate 230 with titanium. Once the titanium layer on the silicon substrate 230 is annealed, TiN layer may be formed on the electroconductive layer 235. Additionally, the thin TiN layer may serve as a seed layer to initiate and aid the growth of the nanowire. The density of the grown nanowires may also further be defined by the structure of the TiN layer.

Additionally, in between the $Al_xGa_{1-x}N$ of the photocathode layer 210 and the electroconductive layer 235, an intermediate layer 225 may be present. The intermediate layer 225 may be composed of a thin AlN layer. The AlN layer may be grown as high-quality layers with a sharp interface using pulsed laser deposition, with its growth rate controlled by HCl gas flow over the aluminum source material used to grow the AlN layer. Additionally, the AlN layer may be used to accommodate the growth of the $Al_xGa_{1-x}N$ layer of the photocathode 210 layer.

For instance, metallic gallium and aluminum source materials may be located in separate gas channels with hydrogen chloride, which leads to the formation of aluminum chloride and gallium chloride. Aluminum chloride and gallium chloride may then be transferred to the silicon substrate 230 with flowing argon, where the chlorides react with ammonia to form AlN and AlGaN on the silicon substrate 230, depending on the AlCl and GaCl ration. Typically, the AlN layer may be used as a thin buffer, or intermediate layer 225, to accommodate the growth of the $Al_xGa_{1-x}N$ layer of the photocathode layer 210. Gallium source materials may then be introduced to produce the $Al_xGa_{1-x}N$ layer on the photocathode 210.

In further embodiments, an isolating layer 240 composed of a thin layer of $Si_3N_4$ may be included, in which an underlying layer 245 of $SiO_2$ may also be present. The isolating layer 240 may isolate electro-conductive silicon from the other layers. Furthermore, a titanium ring electrode 250, 255 may be present at an edge of the top surface and the bottom surface, so that a voltage may be applied to the microchannel plate 200.

Figure 3:
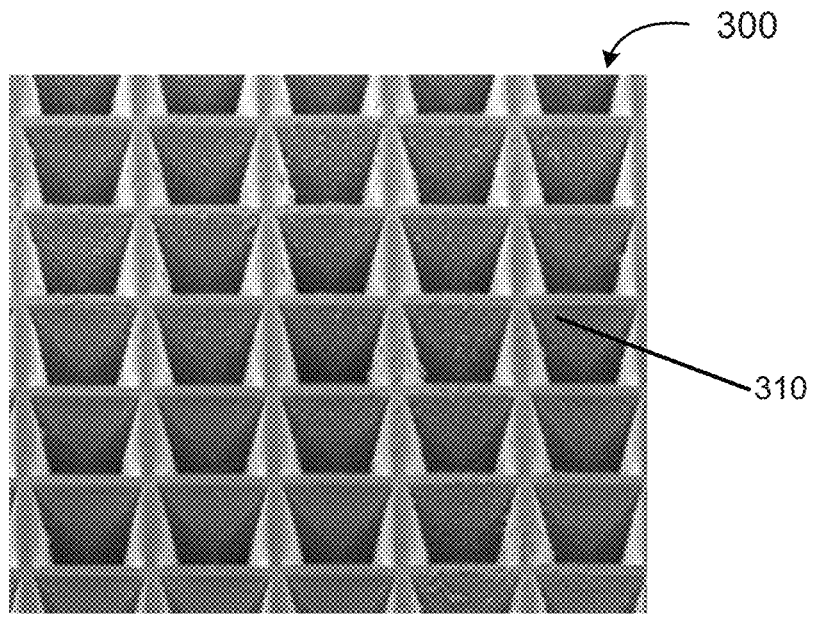
FIG. 3 illustrates a view of a thin-film photocathode layer on a top surface of array of multichannel walls in accordance with various embodiments of the present application.

FIG. 3 illustrates a view of a thin-film photocathode layer 310 on a top surface of an array of multichannel walls 300 in accordance with various embodiments of the present disclosure. Here, a photocathode layer 310 made of $Al_xGa_{1-x}N$ is deposited on the microchannel plate with multichannel walls 300.

Figure 4:
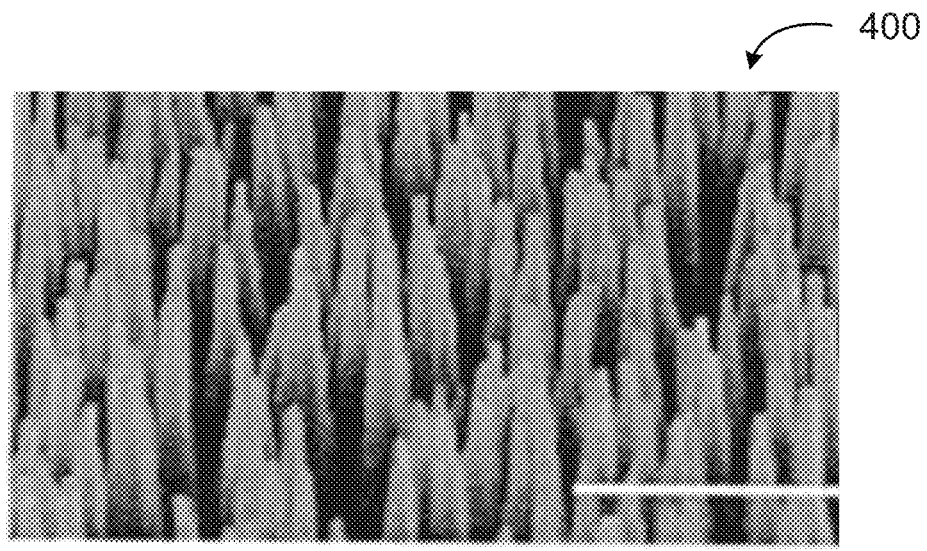
FIG. 4 illustrates a view of nanowires grown on a substrate in accordance with various embodiments of the present application.

FIG. 4 illustrates a view of nanowires 400 grown on a substrate in accordance with various embodiments of the present application. By way of example only, the nanowires 400 may be grown on a selected substrate using hydride vapour phase epitaxy, in which hydrogen chloride is reacted and elevated temperature with the group-III metals to produce gaseous metal chlorides. A proceeding reaction with ammonia then produces group-III nitrides as nanomaterials for the nanowires 400, such as $Al_xGa_{1-x}N$ and GaN. By way of another example, the nanowires 400 may further be grown using plasma assisted molecular beam epitaxy.

The nanowires 400 may be grown vertically, so that the nanowire 400 are perpendicular to the base of the microchannel plate (not shown here). Here, the nanowires 400 have a conical shape, which may help improve the quantum efficiency of the photocathode. The conical shape may further help enhance the light absorption in the nanowire 400 structure, as well as the bending edges of energy bands at the nanowire 400 surface. As such, the conical shape may be one of the most attractive shapes for electron extraction. However, it should be noted that the disclosed nanowire 400 is not limited to the exemplary conical shape, and instead, may be configured in various shapes as would be appreciated by a person of ordinary skill.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A photodetector assembly comprising:
an anode;
a microchannel plate comprising an array of multichannel walls, such that the multichannel walls comprise a silicon substrate; and
a photocathode layer disposed on the microchannel plate, wherein the photocathode layer comprises nanowires deposited on a top surface of the array of multichannel walls.

2. The photodetector assembly of claim 1, wherein the nanowires have a diameter with a range of 30-100 nanometers.

3. The photodetector assembly of claim 1, wherein the multichannel walls comprise a thin film of $Al_xGa_{1-x}N$ at a lower portion of the multichannel wall,
wherein the thin film of $Al_xGa_{1-x}N$ provides as a secondary electron emission layer.

4. The photodetector assembly of claim 1, wherein the nanowires comprise material made of GaN.

5. The photodetector assembly of claim 4, wherein the nanowires comprising GaN is doped with magnesium.

6. The photodetector assembly of claim 1, wherein the nanowires are grown perpendicular to a base of the top surface of the multichannel walls.

7. The photodetector assembly of claim 6, wherein the nanowires are grown in a conical shape.

8. The photodetector assembly of claim 1, wherein the nanowires have a length of 100-500 nanometers.

9. The photodetector assembly of claim 8, wherein the silicon substrate is coated with titanium to form an electroconductive layer for growing the nanowires.

10. The photodetector assembly of claim 1, wherein the multichannel wall is positioned at an inclined angle with respect to a base of the microchannel plate.

11. The photodetector assembly of claim 10, wherein the inclined angle ranges from 5 to 25 degrees.

12. The photodetector assembly of claim 1, wherein the nanowires comprise material made of $Al_xGa_{1-x}N$ with a stoichiometric value of x.

13. The photodetector assembly of claim 12, wherein the stoichiometric value of x is any numerical value between 0 and 1.

14. The photodetector assembly of claim 12, wherein the nanowires comprising $Al_xGa_{1-x}N$ is doped with magnesium.

15. A method of producing a photocathode comprising:
forming an electroconductive layer comprising a titanium layer on a silicon substrate;
creating an intermediate layer comprising an aluminum nitride layer on top of the electroconductive layer; and
growing a nanowire on a surface of the intermediate layer.

16. The method of producing the photocathode of claim 15, further comprising positioning the silicon substrate perpendicular to a direction of gas flow to allow the nanowire to grow perpendicular to a base of the photocathode.

17. The method of producing a photocathode of claim 15, further comprising growing the nanowire on a top surface of a microchannel plate.

18. The method of producing the photocathode of claim 15, wherein the nanowire comprises material made of $Al_xGa_{1-x}N$ with a stoichiometric x value between 0 and 1.

19. The method of producing a photocathode of claim 18, further comprising doping the nanowire with magnesium.

20. A photodetector assembly comprising:
an anode;
a microchannel plate comprising an array of multichannel walls, such that the multichannel walls comprise a silicon substrate; and
a photocathode layer disposed on the microchannel plate, wherein the photocathode layer comprises nanowires deposited on a top surface of the array of multichannel walls and the silicon substrate is coated with titanium to form an electroconductive layer for growing the nanowires.

21. The photodetector assembly of claim 20, wherein the nanowires comprise material made of GaN doped with magnesium.

22. The photodetector assembly of claim 20, wherein the stoichiometric value of x is any numerical value between 0 and 1.

23. The photodetector assembly of claim 22, wherein the nanowires comprising $Al_xGa_{1-x}N$ is doped with magnesium.

24. A photodetector assembly comprising:
an anode;
a microchannel plate comprising an array of multichannel walls; and a photocathode layer disposed on the microchannel plate, wherein the photocathode layer comprises nanowires deposited on a top surface of the array of multichannel walls and the multichannel walls comprise a thin film of $Al_xGa_{1-x}N$ at a lower portion of the multichannel wall such that the thin film of $Al_xGa_{1-x}N$ provides as a secondary electron emission layer.

25. The photodetector assembly of claim 24, wherein the stoichiometric value of x is any numerical value between 0 and 1.

* * * * *